United States Patent
Alter

(10) Patent No.: US 7,315,052 B2
(45) Date of Patent: Jan. 1, 2008

(54) POWER FET WITH EMBEDDED BODY PICKUP

(75) Inventor: Martin Alter, Los Altos, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 11/368,092

(22) Filed: Mar. 2, 2006

(65) Prior Publication Data

US 2007/0205461 A1    Sep. 6, 2007

(51) Int. Cl.
 *H01L 29/76* (2006.01)
(52) U.S. Cl. ........................ 257/288; 257/331
(58) Field of Classification Search ............... 257/288, 257/343; 438/197
See application file for complete search history.

(56) References Cited

U.S. PATENT DOCUMENTS

| | | | | |
|---|---|---|---|---|
| 4,639,754 A * | 1/1987 | Wheatley et al. | ........... | 257/142 |
| 4,951,101 A | 8/1990 | Alter et al. | | |
| 6,727,547 B1 * | 4/2004 | Brisbin et al. | ........... | 257/335 |
| 6,946,706 B1 * | 9/2005 | Brisbin et al. | ........... | 257/343 |
| 2002/0076851 A1 * | 6/2002 | Eden et al. | ........... | 438/106 |
| 2004/0120175 A1 * | 6/2004 | Schrom et al. | ........... | 365/51 |
| 2004/0217418 A1 * | 11/2004 | Imam et al. | ........... | 257/341 |
| 2006/0033171 A1 * | 2/2006 | Sutardja | ........... | 257/401 |
| 2007/0037353 A1 * | 2/2007 | Sutardja | ........... | 438/286 |

OTHER PUBLICATIONS

Brisbin et al. "Hot Carrier Reliability of N-LDMOS Transistor Arrays for Power BiCMOS Applications," International Reliability Physics Symposium Proceedings 2002, pp. 105-110.*

* cited by examiner

*Primary Examiner*—Jerome Jackson
*Assistant Examiner*—Jami M Valentine
(74) *Attorney, Agent, or Firm*—Patent Law Group LLP; Carmen C. Cook

(57) ABSTRACT

A power transistor formed on a semiconductor substrate and including a lateral array of polysilicon lines separated by alternating source and drain regions includes one or more body contact diffusion regions formed in the source regions where each body contact diffusion region has a length that extends to the edges of the two adjacent polysilicon lines, and one or more body pickup contacts where each body pickup contact is formed over a respective body contact diffusion region. In one embodiment, the body contact diffusion regions are formed in a fabrication process using ion implantation of dopants of a first type through a body diffusion mask. Each body contact diffusion region defined by an exposed area in the body diffusion mask has a drawn area that overlaps the respective two adjacent polysilicon lines.

10 Claims, 2 Drawing Sheets

POWER FET WITH EMBEDDED BODY PICKUP

FIELD OF THE INVENTION

The invention relates to power transistors and, in particular, to a power transistor with embedded body pickup contacts for improved ruggedness while maintaining small device size.

DESCRIPTION OF THE RELATED ART

Power transistors or power field effect transistors (FET) are well known semiconductor devices. One type of power transistors is a lateral power transistor formed as an array of transistors. Other power transistor structure includes vertical power transistors. In a lateral power transistor structure, an array of polysilicon lines forms the gate terminal with alternating drain and source regions disposed between the polysilicon lines. The body of the power transistor, having an opposite dopant type to the source/drain regions, can include the substrate and/or one or more diffusion regions (e.g., a well region) in which the source and/or drain regions of the power transistor are formed.

In a power transistor, it is necessary to make an ohmic connection to the body of the transistor and to electrically connect the body to the source terminal of the power transistor. Typically, a body pickup contact is used to contact the body of the power transistor. The body pickup contact is formed over a body contact diffusion region, which is more heavily doped than the substrate, or the body diffusion region, such as a well region, to realize an ohmic contact.

To facilitate shorting to the source terminal, a shorting contact is sometimes used where the contact opening of the shorting contact exposes both the source diffusion region and the body contact diffusion region so that the overlying metal layer, filling the contact opening, acts to electrically short the source and the body together in one contact opening.

However, as fabrication technology moves toward smaller dimensions and the use of tungsten plug contacts, shorting contacts, which typically have to be made bigger than the minimally sized contacts, are disfavored or not allowed entirely in certain fabrication processes. In that case, separate contact holes are formed over the source region and the body contact diffusion region and an overlying metal line covers the separate contact holes to electrically short the source region to the body of the transistor.

FIGS. 1 and 2 illustrate a portion of a conventional lateral power transistor in an intermediate process step and in final form. Referring to FIG. 1, a power field effect transistor (FET) 10 is formed on a substrate 15. After forming the gate oxidation layer (not shown), a polysilicon layer 20 is formed and patterned into stripes to form the gate terminal of the power FET 10. After forming the polysilicon lines 20, the source/drain formation step is carried out. Basically, source/drain implants are introduced into substrate 15 so that substrate areas not covered by the polysilicon lines becomes the source and drain regions of the power FET 10. Alternating diffusion regions of power FET 10 between the polysilicon lines function as the source region and the drain region. For instance, diffusion region 40 becomes the source region while diffusion region 42 becomes the drain region.

In order to form an ohmic contact to the body of the power FET 10 and to facilitate the electrical connection between the source region and the body of the transistor, body contact diffusion regions, having opposite dopant polarity type to the source/drain regions, are formed in the source regions. Assume in the present illustration that power transistor 10 is an N-channel transistor. The source/drain regions 40, 42 are thus formed using n-type dopants while the body contact diffusion regions are formed using p-type dopants. In order to form the body contact diffusion regions in the source region, a mask is used in the source/drain implant step to cover areas in the source regions 40 where the body contact diffusion regions are to be placed. In FIG. 1, a source/drain implant mask 30 including individual islands of developed photoresist is formed on substrate 15 to mask out the substrate areas where the body contact diffusion regions are to be formed. The subsequent source/drain implantation step using mask 30 forms n+ diffusion region everywhere except under the polysilicon lines and except under mask 30. Then, a body implantation step, using a mask that is an inverse of mask 30, is performed to introduce p-type dopants into the body contact diffusion region. Power transistor 10 including source, drain regions 40, 42 and body contact diffusion regions 60 is thus formed, as shown in FIG. 2.

Contact openings 50 are formed in power transistor 10 to make electrical connections to the source, the drain and the body of the transistor. More specifically, contact openings 50 are formed over body contact diffusion regions 60 as well as over the source regions 40. By electrically connecting the contact openings in a respective source region 40, the source region and the body contact diffusion region 60 in that source region will then be electrically shorted.

As semiconductor technology moves to sub-micron fabrication processes, it is necessary to achieve high power efficiency as the size of the power transistor becomes smaller. To maintain or improve power efficiency, the product term Ron*Area needs to be minimized, where Ron is the "on" resistance of the transistor and Area is the transistor area. Meanwhile, the power transistor needs to have improved ruggedness even as the device size continues to shrink. The ruggedness of a power transistor refers to the ability of the transistor to handle high currents and high voltages simultaneously during switching of the transistor.

Referring to power transistor 10 of FIG. 2, to reduce the "on" resistance Ron of the transistor, the spacing "d" between two adjacent polysilicon lines needs to be reduced. However, in conventional fabrication processes, the need to include the body contact diffusion region 60 in the source regions limits the amount of reduction in spacing "d" that can be made. Fabrication processes typically dictate a minimal spacing between the body contact diffusion region 60 and the polysilicon lines. Thus, the necessity of forming the body pickup contact limits the amount of reduction of spacing "d" in power transistor 10 even as technology scales down.

Another difficulty in the manufacturing of the power transistor 10 of FIG. 2 is the source/drain mask 30 used to block out the source/drain implants to areas where the body contact diffusion regions are to be formed. As shown in FIG. 1, when the minimal dimension body contact diffusion region is used in order to achieve the smallest spacing "d", mask 30 becomes an array of islands of photoresist covering the areas where the body pickup contact is to be formed. In a typical power transistor, there may be millions of these photoresist islands present for forming the body pickup contacts.

In today's photolithography process, a photoresist layer can be reliability patterned and developed even when the photoresist pattern involves very thin lines as long as the thin lines have substantial length. However, it is generally more difficult to form small islands of photoresist. Small islands of photoresist may not be properly exposed and may be lifted off during the developing process. Furthermore, it is difficult to maintain the integrity of small photoresist islands when the photoresist islands are subjected to high energy ion bombardment, such as when the patterned photoresist is used for the source/drain implantation step. During the high energy ion bombardment of the ion implantation process, small islands of photoresist are susceptible to degradation, causing the photoresist to be lifted off and redeposited as resist dust, contaminating the substrate. When these photoresist islands are missing off, no body pickup contact is formed. Although the power transistor operates functionally, the ruggedness of the power transistor is compromised when there are insufficient body pickup contacts.

Currently, there is no reliable way to detect lifted-off or peeled off photoresist islands, as these islands exist in numbers of thousands or millions in the source/drain mask. Therefore, a method of forming a power transistor that is more manufacturable is desired. Furthermore, a power transistor with improved manufacturability and improved ruggedness is desired.

SUMMARY OF THE INVENTION

According to one embodiment of the present invention, a power transistor formed on a semiconductor substrate and including a lateral array of polysilicon lines separated by alternating source and drain regions includes one or more body contact diffusion regions formed in the source regions where each body contact diffusion region has a length that extends to the edges of the two adjacent polysilicon lines, and one or more body pickup contacts where each body pickup contact is formed over a respective body contact diffusion region.

In another embodiment, the body contact diffusion regions are formed in a fabrication process using ion implantation of dopants of a first type through a body diffusion mask. Each body contact diffusion region defined by an exposed area in the body diffusion mask has a drawn area that overlaps the respective two adjacent polysilicon lines.

In yet another embodiment, the source and drain regions are formed in the fabrication process using ion implantation of dopants of a second type, opposite to the first type, through a source/drain diffusion mask. The source/drain diffusion mask is an inverse of the body diffusion mask and includes covered areas corresponding to the drawn areas of the body contact diffusion regions.

The present invention is better understood upon consideration of the detailed description below and the accompanying drawings.

DETAILED DESCRIPTION OF THE PREFERRED EMBODIMENTS

In accordance with the principles of the present invention, a power field effect transistor (FET) includes embedded body pickup contacts that are formed over body contact diffusion regions that extend to the two adjacent minimally spaced polysilicon lines. By elongating the body contact diffusion region, the source/drain implant mask includes elongated islands of photoresist defining the body contact diffusion regions where the elongated photoresist islands improve the manufacturability and production worthiness of the power transistor. Meanwhile, the power FET of the present invention can achieve high power efficiency by minimizing the spacing between two polysilicon lines while improving the reliability and ruggedness of the power transistor. Specifically, the spacing between two polysilicon lines can be kept at the minimal distance dictated by the fabrication process so that the area of the transistor and the term Ron*Area are minimized to improve power efficiency.

Figure 1:
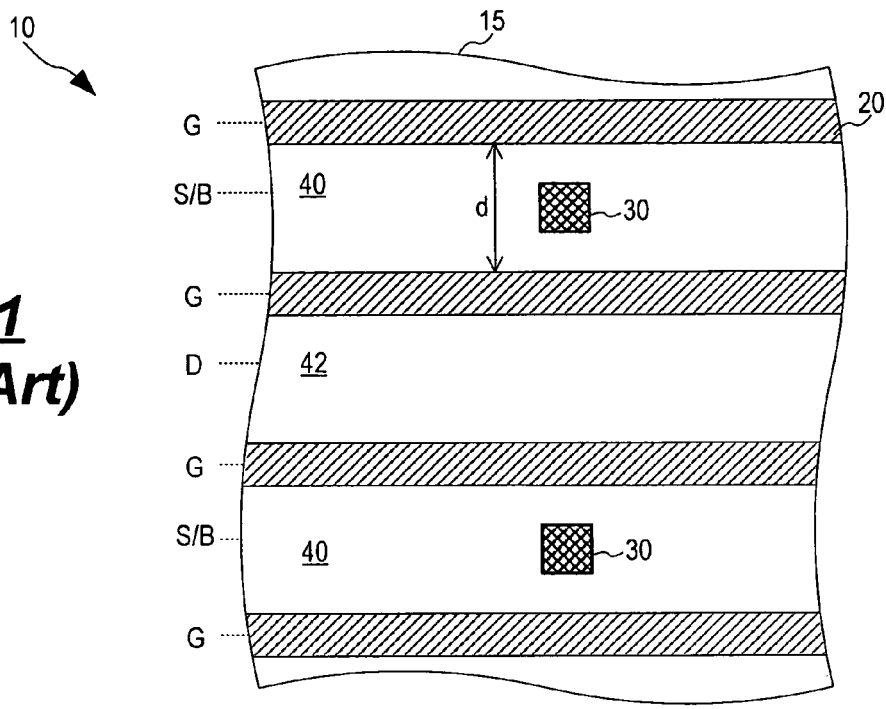
FIGS. 1 and 2 illustrate a portion of a conventional lateral power transistor in an intermediate process step and in final form.
Figure 2:
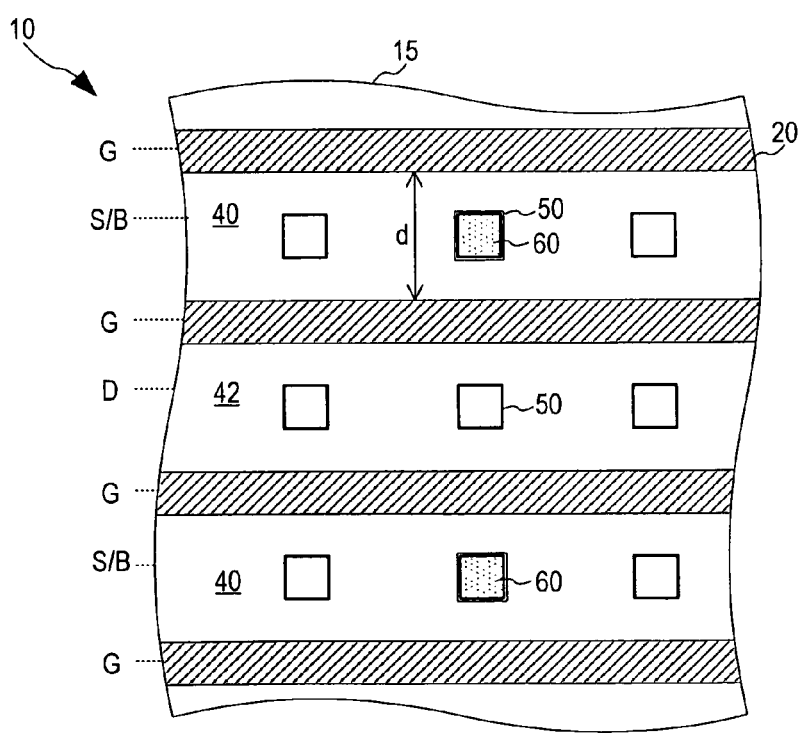

In one embodiment, the power transistor of the present invention realizes up to 30% size reduction as compared to the conventional power transistor of FIG. 2. Furthermore, in one embodiment, the power transistor of the present invention realizes at least a 13% improvement in ruggedness as compared to the conventional power transistor, as determined by the onset of snapback voltage increasing from 10.6V to 12V.

Figure 3:
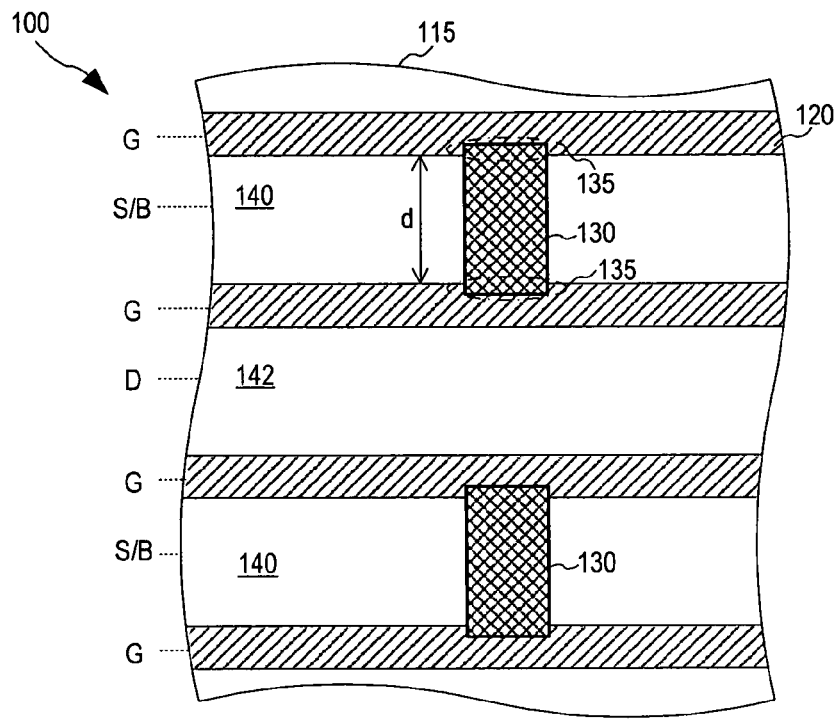
FIG. 3 illustrates a portion of a lateral power transistor according to one embodiment of the present invention during an intermediate process step.
Figure 4:
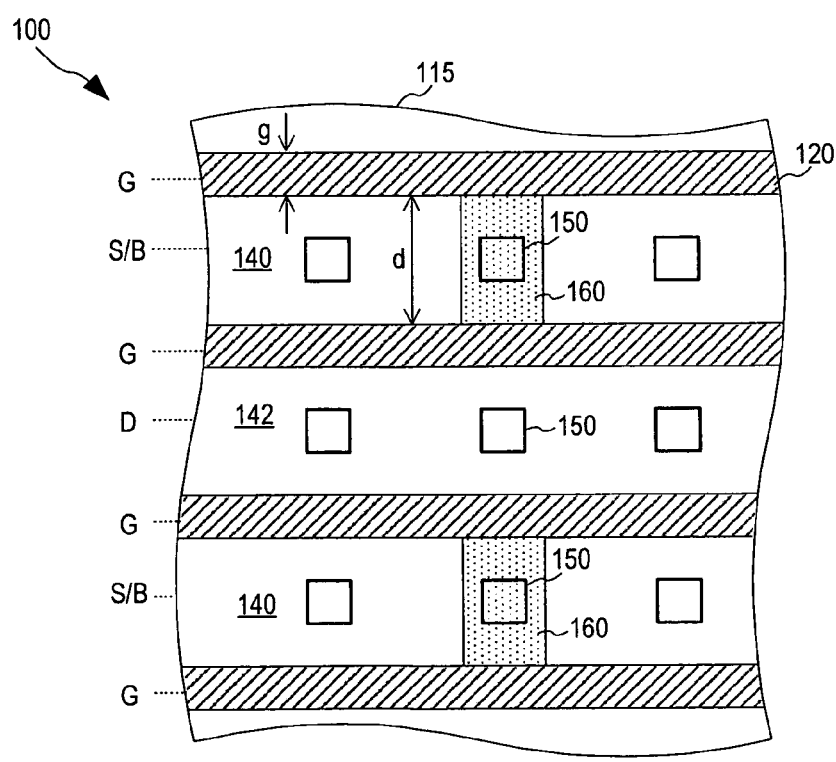
FIG. 4 illustrates the lateral power transistor of FIG. 3 in final form in accordance with the present invention.

FIG. 3 illustrates a portion of a lateral power transistor according to one embodiment of the present invention during an intermediate process step. FIG. 4 illustrates the lateral power transistor of FIG. 3 in final form in accordance with the present invention. In the following description, the power transistor of the present invention is assumed to be an N-channel power transistor formed in a P-type body. Of course, the power transistor of the present invention can also be a P-channel power transistor formed in an N-type body by changing the polarity of the dopant types used to form the power transistor, as is well understood by one of ordinary skill in the art.

Referring to FIG. 3, an N-channel power field effect transitory (FET) 100 is formed on a p-type semiconductor substrate 115. The body of power FET 100 is formed in substrate 115 and can include the substrate and/or one or more diffusion regions formed in the substrate. For example, substrate 115 may include a p-type well region or other lightly doped p-type regions in which the power transistor is formed. The exact structure of the body region of power transistor 100 is not critical to the practice of the present invention.

After forming the gate oxidation layer (not shown), a polysilicon layer 120 is formed on top of the gate oxidation layer and patterned into stripes to form the gate terminal of the power FET 100. After forming the polysilicon lines 120, the source/drain regions of power FET 100 is then formed. In the present embodiment, the source/drain diffusion regions are N-type regions and thus an N+ implantation step is performed through an N+ mask to form the source/drain regions.

In order to form an ohmic contact to the body of the power FET 100 and to facilitate the electrical connection between the source regions and the body of the transistor, body pickup contacts are formed in power FET 100. In N-channel power FET 100, the body pickup contacts are formed over p-type diffusion regions referred to as body contact diffusion regions. The body contact diffusion regions are heavily doped to ensure an ohmic contact with the overlaying metal layer. For instance, in the present embodiment, the body contact diffusion regions can be P+ diffusion regions or P++ diffusion regions.

Therefore, in the formation of N-channel power FET 100, an N+ implantation step is carried out to form the N-type source/drain regions of the transistor while a P+ implantation step is carried out to form the P-type body contact diffusion regions. An N+ mask is used in the N+ implantation step to cover the P-type diffusion areas that are not to receive the N-type dopants. Similarly, a P+ mask is used in the P+ implantation step to cover the N-type diffusion areas that are not to receive the P-type dopants. In general, the N+ mask and the P+ mask are inverse of each other. That is, areas exposed in the N+ mask will be covered in the P+ mask and vice versa.

For power FET 100 of the present invention, an N+ mask 130 is used in the N+ implantation step to form the source/drain regions of the transistor. N+ mask 130 thus needs to cover areas where the P-type body contact diffusion regions are to be placed. In accordance with the present invention, the body contact diffusion regions of power FET 100 are formed as elongated diffusion regions so that the N+ mask 130 includes elongated islands of photoresist as shown in FIG. 3. More specifically, the drawn area of the body contact diffusion regions extends and overlaps the pair of polysilicon lines bordering the body contact diffusion regions, as indicated by the dotted circles 135. In this manner, a sufficiently large piece of photoresist island is formed in N+ mask 130 to improve the manufacturability and the production worthiness of power FET 100.

After N+ mask 130 is formed as shown in FIG. 3, the N+ implantation step can then be carried out to introduce N-type dopants into substrate 115. Areas on substrate 115 not covered by the polysilicon lines 120 and not covered by mask 130 receive the N+ implants and become the source and drain regions of the power FET 100. Alternating diffusion regions of power FET 100 between the polysilicon lines function as the source region and the drain region. For instance, diffusion region 140 becomes the source region while diffusion region 142 becomes the drain region.

After the N+ implant step, mask 130 is removed and the P+ mask (not shown) is formed for use with the P+ implantation step. As described above, the P+ mask is in fact the inverse of the N+ mask 130 and thus covers the entire surface of substrate 115 except for the body contact diffusion regions that was covered by N+ mask 130. Thus, the P+ mask includes openings expose an area on substrate 115 in the source regions 140 that extends to the edge of a pair of adjacent polysilicon lines 120. In fact, the openings in the P+ mask overlap the pair of adjacent polysilicon so that the subsequent P+ implant is self-aligned to the polysilicon gate.

After the P+ implantation step, body contact diffusion regions 160 are formed in the source regions 140, as shown in FIG. 4. Referring to FIG. 4, the resulting body contact diffusion regions 160 extends to the edges of the two adjacent polysilicon lines 120. Contact openings 150 are then formed over the source regions 140 and the drain regions 142 and also over the body contact diffusion regions 160. When contact openings 150 along a single source region 140 are covered with an overlying metal line (not shown), the body contact diffusion region is thereby electrically shorted to the source region 140. As thus formed, power FET 100 including embedded body pickup contacts for improved ruggedness is thus formed.

When the body contact diffusion regions 160 are formed in accordance with the present invention as an elongated diffusion region having a length that extends to the edges of the polysilicon lines, a loss of the source area of the power transistor results which is in generally undesirable. However, when the elongated diffusion region is implemented, the manufacturability of power FET is significantly enhanced so that a slight loss of source area can be tolerated. Furthermore, the frequency of the body pickup contacts in a row of source region can be selected to minimize the loss of source regions. For example, the body pickup contact can be included for every 5 or more source contacts for a strip of source region so that the loss of source area is limited, such as 5% or below. In this manner, the functionality of the power FET 100 is not affected while the ruggedness of the power transistor is improved.

In the present embodiment, the body contact diffusion regions 160 have a width that is wider than the minimal size of the contacts 150. Thus, the N+ mask 130 includes elongated photoresist islands that also have an extended width. The extended width of the photoresist islands further enhances the integrity and manufacturability of power transistor 100. However, in other embodiments, the body contact diffusion regions 160 can be formed having minimal width, that is, having a width equal to the minimal size of the contacts 150. Because the body contact diffusion regions 160 are elongated, the photoresist islands in the N+ mask 130 still have substantial length even though the islands have minimal widths so that integrity of the photoresist islands is still maintained.

Thus, in accordance with the present invention, a power transistor includes body pickup contacts that are formed in the source regions and formed over body contact diffusion regions that extend to the edges of the adjacent polysilicon lines. The width of the body contact diffusion regions can vary from a minimal width equaling the size of the contact opening to a larger width when the loss of source area can be tolerated. Furthermore, the drawn area of the body contact diffusion regions overlaps the adjacent polysilicon lines, as shown by regions 135 in FIG. 3. The amount of polysilicon overlap is not critical to the practice of the present invention. In general, the overlap should have a minimal distance to ensure proper patterning and developing of the photoresist and the overlap may extend further over the polysilicon line. The distance "d" of the source region between two adjacent polysilicon lines can be made to be the minimal distance required by the fabrication process. The product term Ron*Area for the power transistor is minimized to improve the power efficiency while the ruggedness of the power transistor is improved.

In one embodiment, power FET 100 is manufactured using a 0.5 μm CMOS fabrication process where the gate length is 0.5 μm and the contact size is 0.5 μm by 0.5 μm. As is understood by one of ordinary skill in the art, the gate length or the length of the polysilicon lines is the dimension of the polysilicon lines bound by the source region and the drain region, as denoted by the distance "g" in FIG. 4. The minimum gate to contact spacing is 0.4 μm while the minimum gate to gate spacing is 1.3 μm. The drawn area of the body contact diffusion regions (photoresist islands in mask 130) has a length of 1.6 μm and a width of 1 μm. Thus, the photoresist islands overlap the polysilicon lines by 0.15 μm on each side. The width of the drawn area of the body contact diffusion regions can be made smaller or bigger than 1 μm depending on factors such as the impact due to loss of source areas and the tolerance of the photolithography process to thin and short photoresist structures.

In the above description, the power FET of the present invention is a lateral power transistor device and can be an N-channel or a P-channel power transistor. The embedded body pickup contact structure can also be applied to other power transistor devices such as vertical power transistors.

The above detailed descriptions are provided to illustrate specific embodiments of the present invention and are not intended to be limiting. Numerous modifications and variations within the scope of the present invention are possible. The present invention is defined by the appended claims.

I claim:

1. A power transistor formed on a semiconductor substrate and including a lateral array of polysilicon lines separated by alternating source and drain regions, the power transistor comprising:

one or more elongated body contact diffusion regions formed in areas of the source regions not receiving the source diffusion, each elongated body contact diffusion region having a rectangular shape with a width that extends in parallel with the edges of the two adjacent polysilicon lines and a length that extends perpendicular to the edges of the two adjacent polysilicon lines and having a dopant type opposite to the dopant type of the source region; and one or more body pickup contacts, each body pickup contact formed only over a respective body contact diffusion region, wherein the body contact diffusion regions are formed in a fabrication process using ion implantation of dopants of a first type through a body diffusion mask, each body contact diffusion region defined by an exposed area in the body diffusion mask having a drawn area that overlaps the respective two adjacent polysilicon lines.

2. The power transistor of claim 1, wherein the drawn area of the body contact diffusion region in the body diffusion mask overlaps each of the two adjacent polysilicon lines by about 30% of the length of the polysilicon lines.

3. The power transistor of claim 1, wherein the source and drain regions are formed in the fabrication process using ion implantation of a dopants of a second type, opposite to the first type, through a source/drain diffusion mask, the source/drain diffusion mask being an inverse of the body diffusion mask and including covered areas corresponding to the drawn areas of the body contact diffusion regions.

4. The power transistor of claim 3, wherein the power transistor comprises an N-channel power transistor and the body contact diffusion regions are formed using P-type dopants while the source and drain regions are formed using N-type dopants.

5. The power transistor of claim 3, wherein the power transistor comprises a P-channel power transistor and the body contact diffusion regions are formed using N-type dopants while the source and drain regions are formed using P-type dopants.

6. The power transistor of claim 1, further comprising:

one or more source contacts formed in the source regions, the source contacts being formed separate from the body pickup contacts; and a metal line connecting the source contacts and the body pickup contacts formed in each source region.

7. The power transistor of claim 6, wherein in each source region, a body contact diffusion regions and a body pickup contact are included for every N numbers of source contacts.

8. The power transistor of claim 7, wherein N is 5 or greater.

9. The power transistor of claim 1, wherein the body contact diffusion regions each has a width that is at least the same as the size of the body pickup contact.

10. The power transistor of claim 9, wherein the body contact diffusion regions each has a width that is at least twice the size of the body pickup contact.

* * * * *